(12) United States Patent
Fishburn et al.

(10) Patent No.: US 11,974,423 B2
(45) Date of Patent: Apr. 30, 2024

(54) REPLACEMENT CHANNEL PROCESS FOR THREE-DIMENSIONAL DYNAMIC RANDOM ACCESS MEMORY

(71) Applicant: Applied Materials, Inc., Santa Clara, CA (US)

(72) Inventors: Fredrick Fishburn, Aptos, CA (US); Arvind Kumar, Santa Clara, CA (US); Sony Varghese, Manchester, MA (US)

(73) Assignee: Applied Materials, Inc., Santa Clara, CA (US)

( * ) Notice: Subject to any disclaimer, the term of this patent is extended or adjusted under 35 U.S.C. 154(b) by 128 days.

(21) Appl. No.: 17/551,903

(22) Filed: Dec. 15, 2021

(65) Prior Publication Data
US 2022/0199627 A1 Jun. 23, 2022

Related U.S. Application Data

(60) Provisional application No. 63/127,811, filed on Dec. 18, 2020.

(51) Int. Cl.
*H10B 12/00* (2023.01)

(52) U.S. Cl.
CPC .............. *H10B 12/05* (2023.02); *H10B 12/03* (2023.02)

(58) Field of Classification Search
CPC ...... H10B 12/03; H10B 12/05; H10B 12/053; H10B 12/056; H10B 12/30
See application file for complete search history.

(56) References Cited

U.S. PATENT DOCUMENTS

| | | |
|---|---|---|
| 8,114,757 B1 | 2/2012 | Or-Bach et al. |
| 9,000,557 B2 | 4/2015 | Or-Bach et al. |
| 9,023,688 B1 | 5/2015 | Or-Bach et al. |
| 2020/0111917 A1* | 4/2020 | Ramaswamy .... H01L 29/78696 |
| 2020/0343246 A1* | 10/2020 | Wang ................ H01L 29/40114 |

* cited by examiner

*Primary Examiner* — Nicholas J Tobergte
*Assistant Examiner* — Kevin Quinto
(74) *Attorney, Agent, or Firm* — Patterson + Sheridan, LLP

(57) ABSTRACT

Examples herein relate to three-dimensional (3D) dynamic random access memory (DRAM) devices and replacement channel processes for fabricating 3D DRAM devices. In an example, a gate dielectric layer is formed on a sacrificial material, and a gate electrode is formed on the gate dielectric layer. After the gate electrode is formed, the sacrificial material is removed and replaced by a semiconductor material. A channel region of a device (e.g., a transistor) that includes the gate dielectric layer and gate electrode is formed in the semiconductor material. The channel region can be vertical or horizontal with respect to a main surface of a substrate on which the device is formed. A capacitor can be formed, such as before or after the semiconductor material is formed, and is electrically connected to the semiconductor material. The device and the capacitor together can form at least part of a 3D DRAM cell.

19 Claims, 8 Drawing Sheets

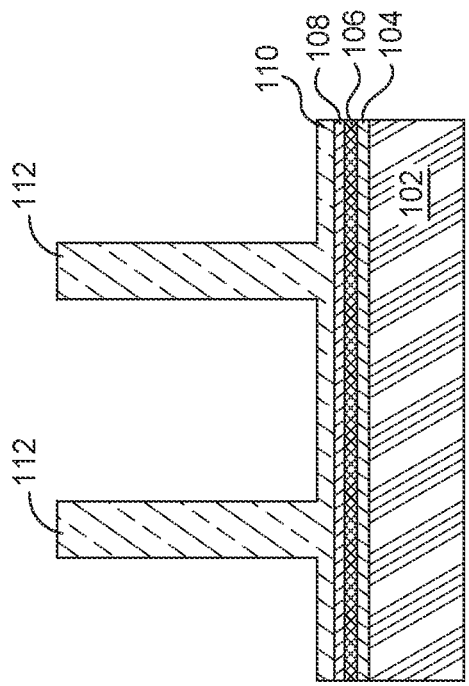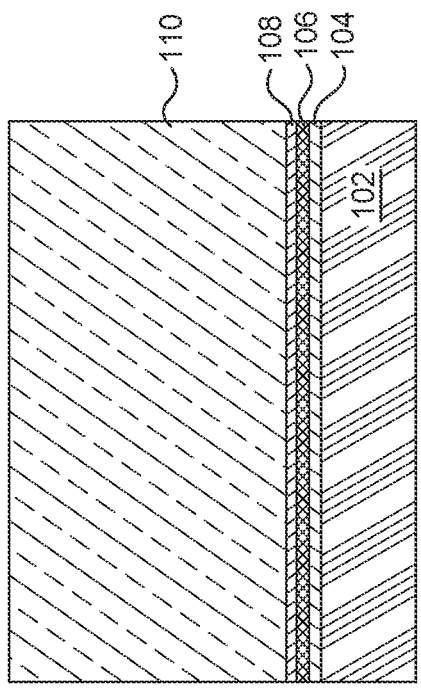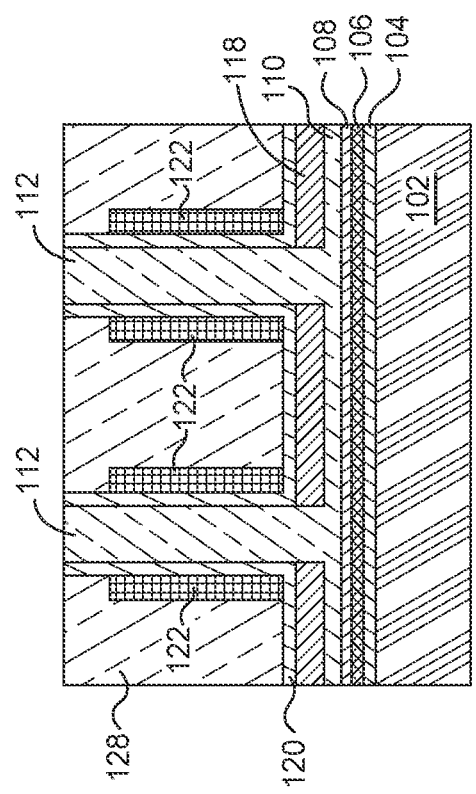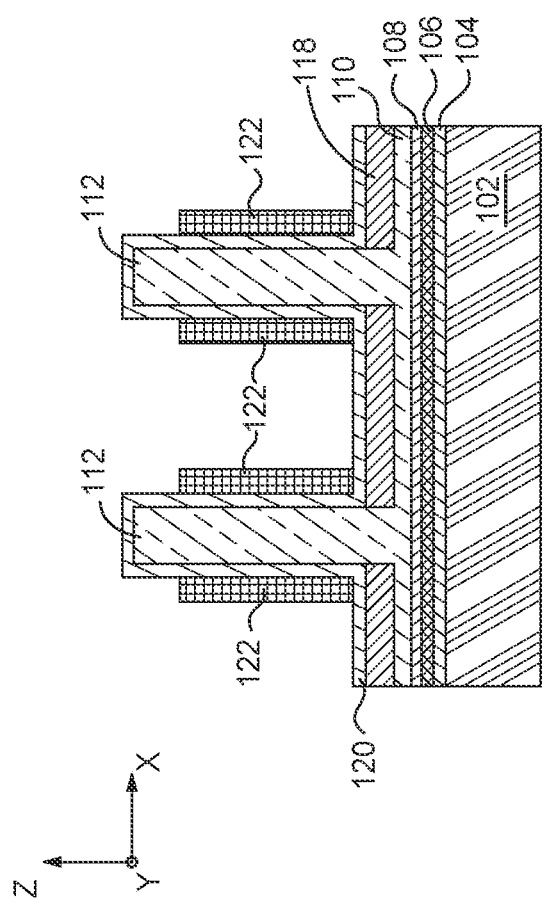

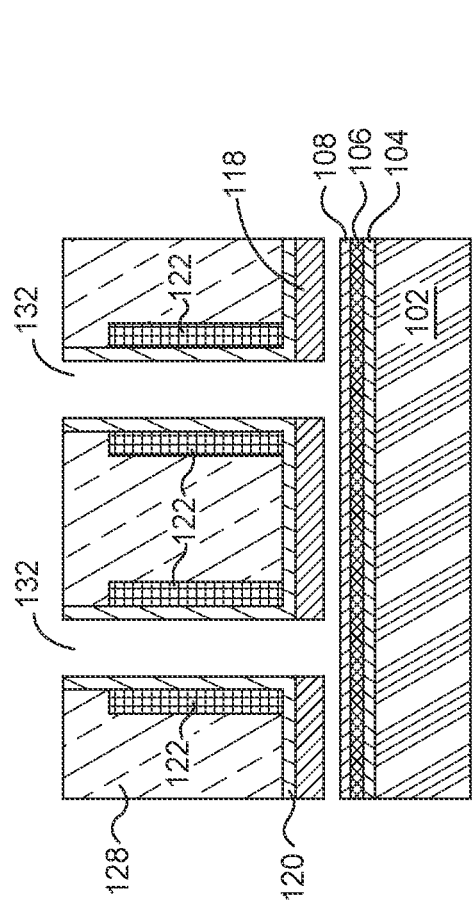
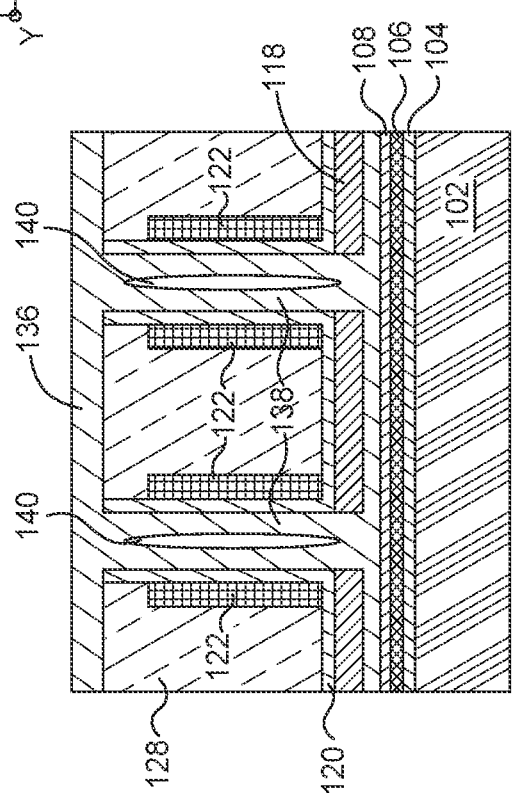
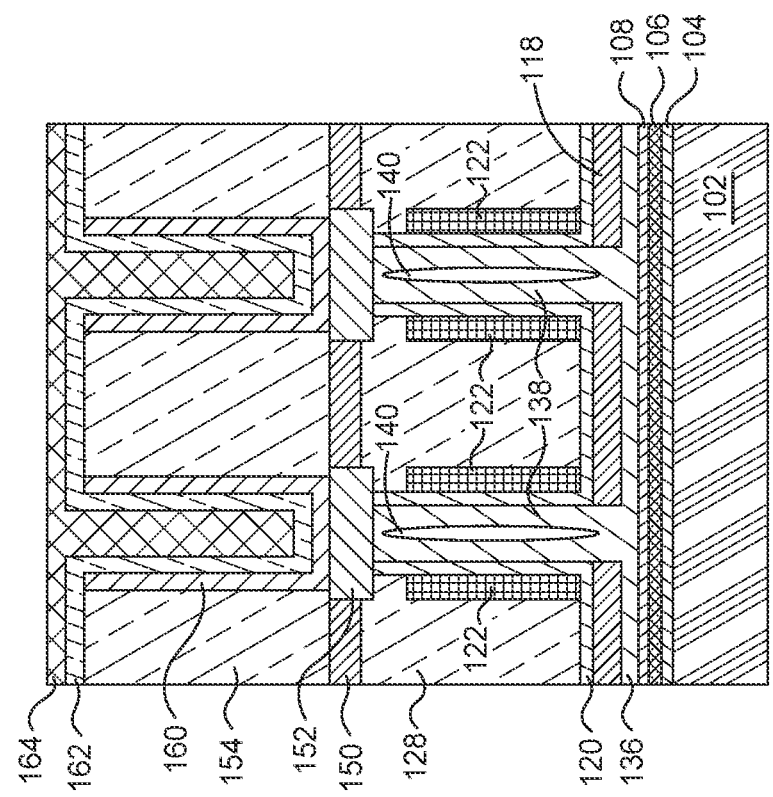

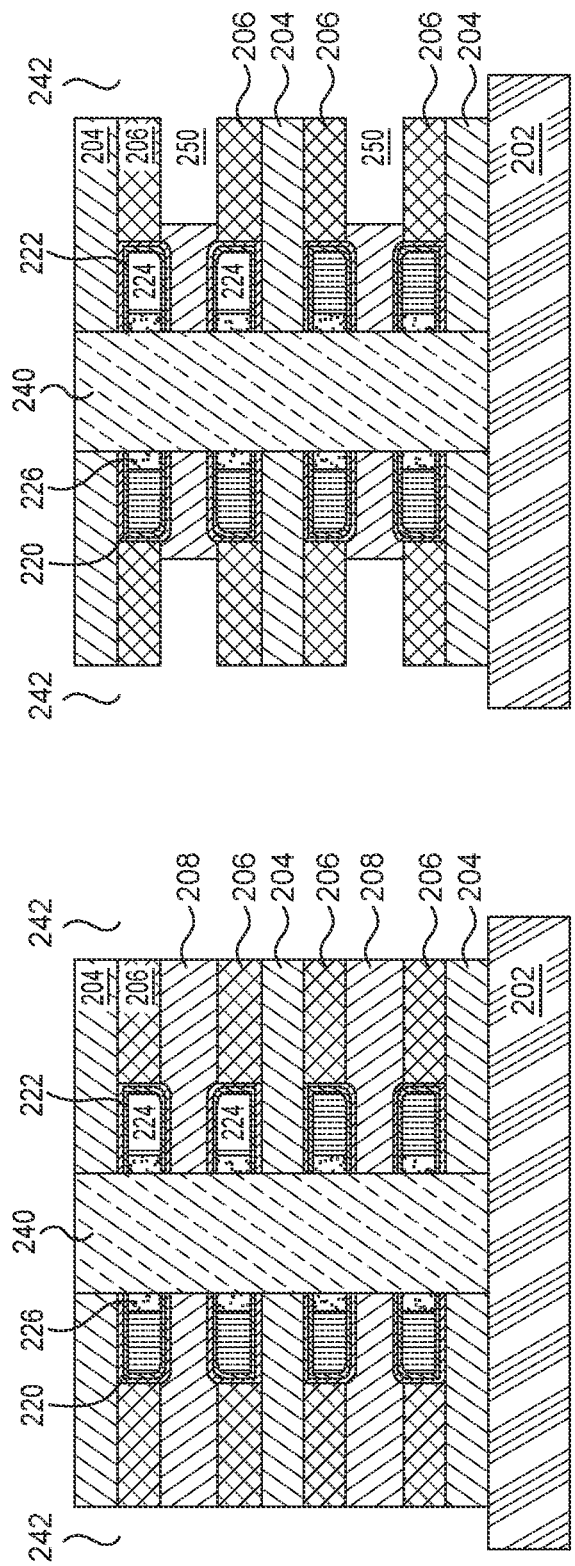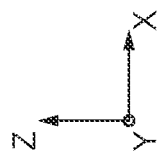
FIG. 15
FIG. 16

REPLACEMENT CHANNEL PROCESS FOR THREE-DIMENSIONAL DYNAMIC RANDOM ACCESS MEMORY

CROSS-REFERENCE TO RELATED APPLICATIONS

This application claims priority to U.S. Provisional Patent Application Ser. No. 63/127,811, filed Dec. 18, 2020, which is incorporated herein by reference in its entirety.

BACKGROUND

Field

Examples described herein generally relate to semiconductor devices and processes for fabricating semiconductor devices, and more particularly, to three-dimensional (3D) dynamic random access memory (DRAM) devices and replacement channel processes for fabricating 3D DRAM devices.

Description of the Related Art

Technology advances in semiconductor processing have resulted in integrated circuits reaching the physical limits of Moore's Law. These advances have resulted in new paradigms for devices and structures in integrated circuits. For example, various three-dimensional (3D) devices have been developed for integrated circuits. Devices having improved device performance, such as a higher mobility, lower leakage current, and desired Vth position may be required. However, such 3D devices can result in a new set of challenges for processing and fabrication.

Accordingly, what is needed in the art are 3D devices that have an improved device performance and method of fabricating the same.

SUMMARY

Examples of the disclosure include a method of semiconductor processing comprising forming a gate dielectric layer on a sacrificial material disposed on a substrate, forming a gate electrode on the gate dielectric layer, after forming the gate electrode, removing the sacrificial material to form a recess opening, forming a semiconductor material in the recess opening where the sacrificial material was removed, and forming a capacitor that is electrically connected to the semiconductor material.

Examples of the disclosure include a method for semiconductor processing, comprising forming a sacrificial pillar on a substrate, the sacrificial pillar extending away from a surface of the substrate, forming a gate dielectric layer on a sidewall surface of the sacrificial pillar, forming a gate electrode on the gate dielectric layer, after forming the gate electrode, replacing the sacrificial pillar with a semiconductor pillar, and forming a capacitor electrically connected to the semiconductor pillar.

Examples of the disclosure include a method of semiconductor processing comprising the following. Forming a film stack on a substrate, the film stack comprising one or more unit stacks, each unit stack of the one or more unit stacks comprising a first dielectric layer and a sacrificial layer, and forming a first opening in the film stack. Laterally recessing the first dielectric layer in each unit stack exposed by the first opening to form a first lateral recess. Forming a gate dielectric layer in the first lateral recess and on the sacrificial layer in each unit stack, and forming a gate electrode on the gate dielectric layer in each unit stack. After forming the gate electrode, replacing at least a portion of the sacrificial layer with a semiconductor layer, and then forming a capacitor electrically connected to the semiconductor layer.

BRIEF DESCRIPTION OF THE DRAWINGS

So that the manner in which the above recited features of the present disclosure can be understood in detail, a more particular description, briefly summarized above, may be had by reference to examples, some of which are illustrated in the appended drawings. It is to be noted, however, that the appended drawings illustrate only some examples and are therefore not to be considered limiting of the scope of this disclosure, for the disclosure may admit to other equally effective examples.

FIGS. 4 through 10 are cross-sectional views of intermediate structures during a first method to form 3D DRAM cells according to some examples of the present disclosure.

FIGS. 11 through 19 are cross-sectional views of intermediate structures during a second method to form 3D DRAM cells according to some examples of the present disclosure.

To facilitate understanding, identical reference numerals have been used, wherever possible, to designate identical elements that are common to the figures.

DETAILED DESCRIPTION

Figure 1:
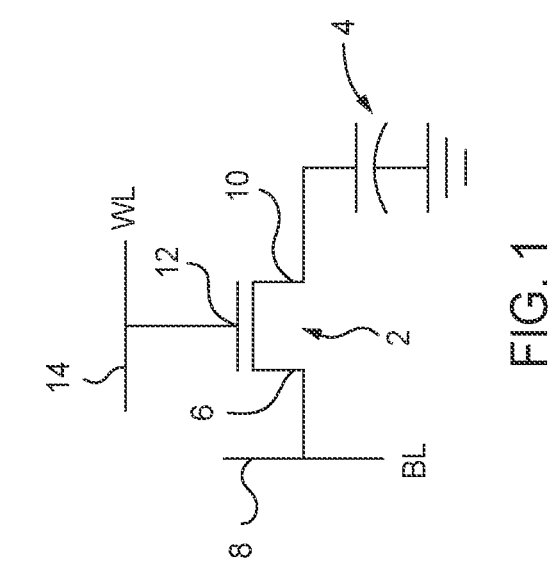
FIG. 1 is a circuit schematic of a dynamic random access memory (DRAM) cell according to some examples of the present disclosure.

Generally, examples described herein relate to three-dimensional (3D) dynamic random access memory (DRAM) devices and replacement channel processes for fabricating 3D DRAM devices. Generally, in the fabrication of a 3D DRAM cell, a gate dielectric layer is formed on a sacrificial material, and a gate electrode is formed on the gate dielectric layer. After the gate electrode is formed, the sacrificial material is removed and replaced by a semiconductor material. A channel region of a device (e.g., a transistor) that includes the gate dielectric layer and gate electrode can be formed in the semiconductor material. The channel region (e.g., a direction through which carriers flow) can be vertical or horizontal with respect to a main surface (e.g., a top surface) of a substrate on which the device is formed. A capacitor can be formed, such as before or after the semiconductor material is formed, and is electrically connected to the semiconductor material. The device and the capacitor together can form at least part of a 3D DRAM cell.

The properties of some semiconductor materials can be sensitive to certain semiconductor processing steps. For those semiconductor materials, the exposure to some semiconductor processing steps can degrade characteristics of the semiconductor materials. As an example, indium gallium zinc oxide (IGZO) can be sensitive to high temperature processing and to exposure to plasma processing. Exposure of IGZO to a plasma, such as during a reactive ion etch (RIE) process, can damage the IGZO material due ion bombardment, which can result in increased current leakage through the IGZO material. Additionally, depositing materials on IGZO can cause degraded material properties. For example, deposition processes that use oxygen and/or hydrogen to deposit a material on IGZO have been observed to cause oxygen and/or hydrogen to diffuse into or be depleted from the IGZO material, which can cause the IGZO material to have decreased carrier mobility (e.g., increasing an insulative characteristic) or increased carrier mobility (e.g., increasing a conductive characteristic), respectively. This can result in IGZO not behaving with a desired semiconductive characteristic. Accordingly, examples described herein reduce or avoid these affects by forming a semiconductor material, such as IGZO, later in a device fabrication process by use of a replacement channel process. Such a replacement channel process reduces or avoids exposure of the semiconductor material to processing that may degrade the semiconductor material.

Various different examples are described below. Although multiple features of different examples may be described together in a process flow, the multiple features can each be implemented separately or individually and/or in a different process flow. Additionally, various process flows are described as being performed in an order; other examples can implement process flows in different orders and/or with more or fewer operations. Additionally, although source and drain nodes and source and drain regions are described separately in various examples, such description can more generally be to a source/drain node or source/drain region.

FIG. 1 is a circuit schematic of a DRAM cell according to some examples of the present disclosure. The DRAM cell includes an access transistor 2 and a capacitor 4. A drain node 6 of the access transistor 2 is electrically connected to a bitline (BL) node 8. A source node 10 of the access transistor 2 is electrically connected to a first terminal of the capacitor 4, and a second terminal of the capacitor 4 (opposite from the first terminal) is electrically connected to a power supply node (e.g., a ground node). A gate node 12 of the access transistor 2 is electrically connected to a wordline (WL) node.

Figure 2:
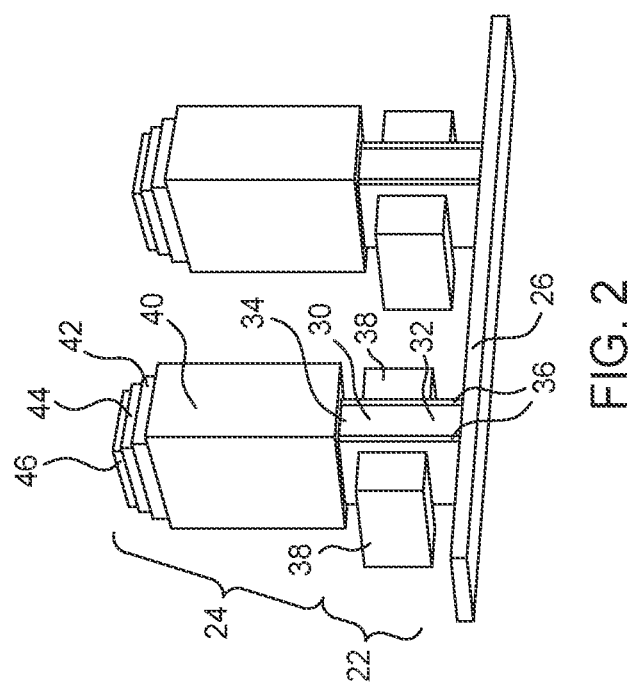
FIG. 2 is a perspective view of vertical channel device 3D DRAM cells according to some examples of the present disclosure.

FIG. 2 is a perspective view of vertical channel device 3D DRAM cells according to some examples of the present disclosure. FIG. 2 depicts two 3D DRAM cells that each include a vertical channel device (e.g., a transistor). To avoid unnecessarily obscuring aspects of the figures, one DRAM cell is labeled with reference numbers, and a person having ordinary skill in the art will readily understand common components in the other DRAM cell of FIG. 2. Additionally, the structures illustrated in FIG. 2 may omit various components to more clearly illustrate various features. A person having ordinary skill in the art will readily understand other components that may be included in similar structures.

A DRAM cell includes an access transistor 22 and a capacitor 24. The access transistor 22 includes a semiconductor material 30 that is disposed on and extends vertically from a bit line contact 26. The semiconductor material 30 forms the active region of the access transistor 22 and includes a channel region of the access transistor 22. A drain region 32 and a source region 34 are disposed in the semiconductor material 30 with the channel region between the drain region 32 and the source region 34 in the semiconductor material 30. The drain region 32 is disposed proximate to and/or adjoining the bit line contact 26, and the source region 34 is distal from the bit line contact 26. A gate dielectric layer 36 is disposed on the semiconductor material 30 (e.g., on sidewall surfaces of the semiconductor material 30), and a gate electrode 38 is disposed on the gate dielectric layer 36. FIG. 2 shows a cut-away portion of the access transistor 22 to illustrate the semiconductor material 30. As will be readily understood from subsequent description, the gate dielectric layer 36 can be disposed laterally encircling the semiconductor material 30, and the gate electrode 38 can be disposed laterally encircling the gate dielectric layer 36.

The capacitor 24 includes an outer plate 40, a capacitor dielectric layer 42, and an inner plate 44. The outer plate 40 is a conductive material, such as a metal or metal-containing material. The outer plate 40 generally has the shape of a single-capped vertical cylinder, single-capped rectangular prism, or the like. The outer plate 40 generally extends vertically from the access transistor 22 and has a capped end that contacts the source region 34 of the access transistor 22 to electrically connect the source region 34 to the capacitor 24. The end of the outer plate 40 opposite from the access transistor 22 is open. The capacitor dielectric layer 42 is a dielectric material that is disposed conformally along interior surfaces of the outer plate 40. The dielectric material of the capacitor dielectric layer 42 can be a high-k dielectric material (e.g., having a k-value greater than 4.0). The inner plate 44 is a conductive material, such as a metal or metal-containing material, and is disposed on the capacitor dielectric layer 42 and fills a remaining interior portion of the outer plate 40. A power supply contact 46 (e.g., a ground contact) is disposed laterally and contacts the inner plate 44 of the capacitor 24.

Figure 3:
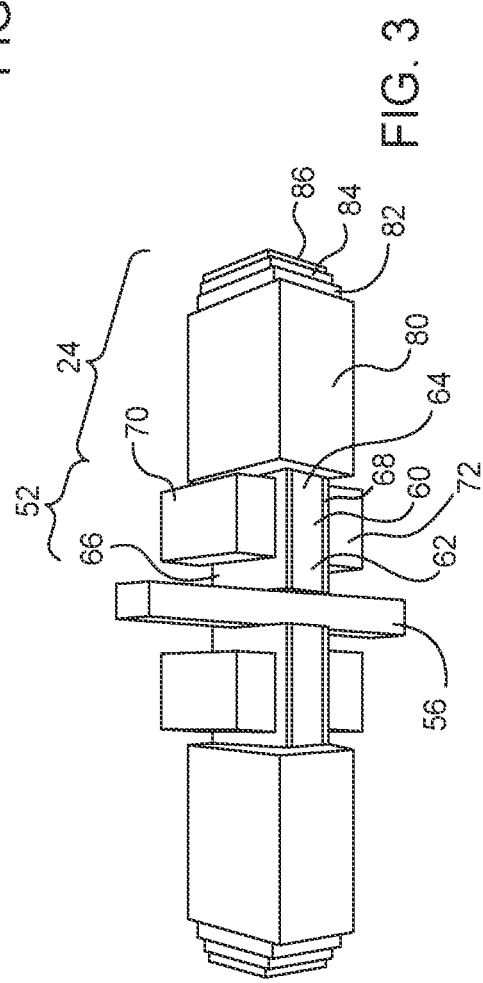
FIG. 3 is a perspective view of horizontal channel device 3D DRAM cells according to some examples of the present disclosure.

FIG. 3 is a perspective view of horizontal channel device 3D DRAM cells according to some examples of the present disclosure. FIG. 3 depicts two DRAM cells that are mirrored along a vertical axis, which may be referred to herein for convenience as a mirrored DRAM pair. As will become apparent in subsequent description, multiple mirrored DRAM pairs (e.g., two pairs, three pairs, etc.) may be stacked vertically in a DRAM structure. To avoid unnecessarily obscuring aspects of the figures, one DRAM cell of a mirrored DRAM pair is labeled with reference numbers, and a person having ordinary skill in the art will readily understand mirrored components in the other DRAM cell of the mirrored DRAM pair. Additionally, the structures illustrated in FIG. 3 may omit various components to more clearly illustrate various features. A person having ordinary skill in the art will readily understand other components that may be included in similar structures.

A DRAM cell includes a transistor 52 and a capacitor 54. The transistor 52 includes a semiconductor material 60 that is disposed adjoining and extending horizontally from a bit line contact 56. The semiconductor material 60 forms the active region of the transistor 52 and includes a channel region of the access transistor 22. A drain region 62 and a source region 64 are disposed in the semiconductor material 60 with the channel region between the drain region 62 and the source region 64 in the semiconductor material 60. The drain region 62 is disposed proximate to and/or adjoining the bit line contact 56, and the source region 64 is distal from the bit line contact 56. A top gate dielectric layer 66 is disposed on the semiconductor material 60 (e.g., on a top surface of the semiconductor material 60), and a bottom gate dielectric layer 68 is disposed on the semiconductor material 60 on a side opposite from the top gate dielectric layer 66 (e.g., on a bottom surface of the semiconductor material 60). A top gate electrode 70 is disposed over the top gate dielectric layer 66, and a bottom gate electrode 72 is disposed below the bottom gate dielectric layer 68.

The capacitor 54 includes an outer plate 80, a capacitor dielectric layer 82, and an inner plate 84. The outer plate 80 is a conductive material, such as a metal or metal-containing material. The outer plate 80 generally has the shape of a single-capped horizontal cylinder, single-capped rectangular prism, or the like. The outer plate 80 generally extends laterally from the transistor 52 and has a capped end that contacts the source region 64 of the transistor 52 to electrically connect the source region 64 to the capacitor 54. The end of the outer plate 80 opposite from the transistor 52 is open. The capacitor dielectric layer 82 is a dielectric material that is disposed conformally along interior surfaces of the outer plate 80. The dielectric material of the capacitor dielectric layer 82 can be a high-k dielectric material (e.g., having a k-value greater than 4.0). The inner plate 44 is a conductive material, such as a metal or metal-containing material, and is disposed on the capacitor dielectric layer 82 and fills a remaining interior portion of the outer plate 80. A power supply contact 86 (e.g., a ground contact) is disposed laterally contacting the inner plate 84 of the capacitor 54.

FIGS. 4 through 10 are cross-sectional views of intermediate structures formed during a first method used to form 3D DRAM cells according to some examples of the present disclosure. The 3D DRAM cells formed according to the first method of FIGS. 4 through 10 can form part of the vertical channel device 3D DRAM cells shown in FIG. 2.

Referring to FIG. 4, a film stack is deposited on a substrate 102. The substrate 102 includes any appropriate semiconductor substrate, such as a bulk substrate, semiconductor-on-insulator (SOI) substrate, or the like. In some examples, the semiconductor substrate is a bulk silicon wafer. Examples of substrate sizes include 200 mm diameter, 350 mm diameter, 400 mm diameter, and 450 mm diameter, among others. The substrate 102 can further include any layer (e.g., any number of other dielectric layers) or structure on the semiconductor substrate.

The film stack includes a first barrier layer 104, a conductive layer 106, a second barrier layer 108, and a sacrificial layer 110. The first barrier layer 104 is deposited on the substrate 102. The conductive layer 106 is deposited on the first barrier layer 104. The second barrier layer 108 is deposited on the conductive layer 106. The sacrificial layer 110 is deposited on the second barrier layer 108. The first barrier layer 104, conductive layer 106, second barrier layer 108, and sacrificial layer 110 can be deposited by any appropriate deposition process, such as chemical vapor deposition (CVD), atomic layer deposition (ALD), physical vapor deposition (PVD), or the like. In some examples, the first barrier layer 104 and the second barrier layer 108 are each titanium nitride (TiN), tantalum nitride (TaN), or the like. In some examples, the conductive layer 106 is a metal or metal-containing material, such as tungsten (W) or the like. In some examples, the sacrificial layer 110 is amorphous or polycrystalline silicon. The materials for the first barrier layer 104, conductive layer 106, second barrier layer 108, and sacrificial layer 110 can be other materials. Particularly, the material of the sacrificial layer 110 can be any material that permits the sacrificial layer 110 to be selectively removed relative to other remaining materials and layers during subsequent processing, as will become apparent.

After depositing the first barrier layer 104, conductive layer 106, second barrier layer 108, and sacrificial layer 110, the first barrier layer 104, conductive layer 106, second barrier layer 108, and sacrificial layer 110 are patterned into a bit line. The patterning is not apparent in the cross-section of FIG. 4. The patterning forms patterned lines of stacked portions of the respective layers 104-110. The cross-section of FIG. 4 is along a longitudinal (e.g., X-Z plane in FIG. 4) length of one patterned line. Cross-sections of multiple patterned lines would be seen in a cross-section perpendicular (e.g., Y-Z plane) to the cross-section of FIG. 4. For a patterned line, the first barrier layer 104, conductive layer 106, second barrier layer 108 in that patterned line form at least a portion of a bit line contact. The patterning can be performed using any appropriate photolithography and etching processes. An anisotropic etch, such as a reactive ion etch (RIE), may be used.

Referring to FIG. 5, the sacrificial layer 110 in the patterned line is patterned to form sacrificial pillars 112. A bottom portion of the sacrificial layer 110 can remain disposed on the second barrier layer 108, which can connect the sacrificial pillars 112 in the respective patterned line. The patterning can be performed using any appropriate photolithography and etching processes. In one example, an anisotropic etch, such as a RIE, may be used.

Referring to FIG. 6, a spacer layer 118, a gate dielectric layer 120, and gate electrodes 122 are formed. The spacer layer 118 can be formed by depositing the material of the spacer layer 118 to a thickness that is in excess of the height of the sacrificial pillars 112. In some examples, the material of the spacer layer 118 is deposited by CVD, flowable CVD (FCVD), PVD, or another deposition process. If appropriate, the material of the spacer layer 118 can be planarized, such as by a chemical mechanical polish (CMP). The material of the spacer layer 118 is etched back such that the sacrificial pillars 112 protrude from the spacer layer 118. The etch process can be an isotropic etch, which may be a wet or dry process. In some examples, the spacer layer 118 can be any appropriate dielectric material, such as silicon nitride, silicon oxide, or the like.

Of note, although not apparent from the cross-section of FIG. 6, the spacer layer 118 is disposed between neighboring patterned lines of the layers 104-110, such as disposed along facing sidewalls of the layers 104-110 of the neighboring patterned lines. Additionally, the spacer layer 118 is disposed on and directly contacting the substrate 102 between the patterned lines. Such features of the spacer layer 118 would be viewable in a cross-section perpendicular to the cross-section of FIG. 6.

The gate dielectric layer 120 is conformally deposited on the sacrificial pillars 112 that protrude from the spacer layer 118. The gate dielectric layer 120 is deposited on sidewall surfaces and top surfaces of the sacrificial pillars 112 and on a top surface of the spacer layer 118. The gate dielectric layer 120 is disposed on sidewalls of a respective sacrificial pillar 112 to laterally encircle that sacrificial pillar 112. The gate dielectric layer 120 can be deposited by ALD, CVD, or another conformal deposition process. In some examples, the gate dielectric layer 120 is a high-k dielectric material. In some examples, the gate dielectric layer 120 is alumina ($Al_2O_3$).

Gate electrodes 122 can be formed by conformally depositing a material of the gate electrodes 122 on the gate dielectric layer 120 followed by anisotropically etching the material of the gate electrodes 122. The conformal deposition of the material of the gate electrodes 122 can form a layer of material conformally along the surface of the gate dielectric layer 120. The anisotropic etch removes laterally extending portions of deposited gate electrodes 122 layer, such as portions between sacrificial pillars 112 and portions on top of the sacrificial pillars 112. The anisotropic etch can further etch back vertical portions along sidewalls of the sacrificial pillars 112 such that the sacrificial pillars 112 protrude vertically from the gate electrodes 122. Each of the formed gate electrodes 122 is disposed on a portion of the gate dielectric layer 120 that is on sidewalls of a respective sacrificial pillar 112 such that the respective gate electrode 122 laterally encircles the sacrificial pillar 112. The material of the gate electrodes 122 can be deposited by ALD, CVD, or another conformal deposition process. The anisotropic etch process can be a RIE or another etch process. The material of the gate electrodes 122 can be a single material or multiple different materials (e.g., in multiple different layers.) In some examples, the gate electrodes 122 are a metal or metal-containing material, such as tungsten (W) or the like.

Referring to FIG. 7, a first inter-layer dielectric (ILD) layer 128 is deposited on the gate dielectric layer 120 and gate electrodes 122. The first ILD layer 128 can be any dielectric layer, such as silicon oxide, borophosphosilicate glass (BPSG), phosphosilicate glass (PSG), or the like. The first ILD layer 128 can be deposited by CVD, FCVD, or another appropriate deposition process. The first ILD layer 128 is then planarized, such as by use of a CMP process. The planarization of the first ILD layer 128 further removes respective portions of the gate dielectric layer 120 from top surfaces of the sacrificial pillars 112. Following the planarization, the top surface of the sacrificial pillars 112 are exposed through the first ILD layer 128 and the gate dielectric layer 120.

Referring to FIG. 8, the sacrificial layer 110 of the patterned line, including the sacrificial pillars 112, is removed. Removing the sacrificial layer 110 causes openings 132 (or also referred to herein as recess openings) to be formed where the sacrificial pillars 112 were removed. Each opening 132 is laterally defined by the gate dielectric layer 120 that was on the sidewalls of the respective sacrificial pillar 112 that was removed. A surface of the second barrier layer 108 is exposed through a respective portion of the opening 132. Although an entirety of the sacrificial layer 110 is illustrated in FIG. 8 to be removed, in some examples, portions of the sacrificial layer 110 may remain, such as on the second barrier layer 108 between openings 132. An etch process that is selective to the material of the sacrificial layer 110 can be used to remove the sacrificial layer 110 and the sacrificial pillars 112. The etch process can be an isotropic etch process, which may be a wet or dry process. In some examples where the sacrificial layer 110 is silicon, tetramethylammonium hydroxide (TMAH) may be used to remove the sacrificial layer 110.

Referring to FIG. 9, a semiconductor material 136 is deposited where the sacrificial layer 110 was removed, including in the openings 132. The semiconductor material 136 is deposited on (e.g., directly contacting) the surface of the second barrier layer 108 exposed through the respective opening 132. The semiconductor material 136 may form a part of the bit line contact with the first barrier layer 104, conductive layer 106, and second barrier layer 108 in the patterned line. The semiconductor material 136 extends vertically (e.g., Z-direction) from the second barrier layer 108 to form semiconductor pillars 138 in the respective openings 132. A channel region of an access transistor is to be disposed in the semiconductor material 136 disposed in a respective opening 132 defined by the gate dielectric layer 120.

The semiconductor material 136 can be deposited by a conformal deposition process, in some examples. The conformal deposition can result in voids 140 being formed in the semiconductor material 136 deposited in the openings 132 (e.g., the semiconductor pillars 138). For example, the conformal deposition can result in pinch-off of the semiconductor material 136 at the top of the openings 132, which can cause respective voids 140 to remain in the semiconductor pillars 138. In other examples, the openings 132 are completely filled by the semiconductor pillars 138 without a void. In various examples, any opening 132 can be completely filled by the semiconductor pillars 138 or filed with the semiconductor pillars 138 having a void or seam therein. In some examples, the semiconductor material 136 can be deposited by ALD, CVD, or any other conformal deposition process. In other examples, the semiconductor material 136 is deposited by a non-conformal deposition process, such as a bottom-up selective deposition process.

The semiconductor material 136 can be any appropriate semiconductor material. Some examples contemplate that the semiconductor material 136 is a material that may become degraded due to high temperature processing, plasma processing, or any other semiconductor processing. By replacing the sacrificial pillars 112 with the semiconductor pillars 138 as described, high temperature processing (e.g., such as equal to or greater than 400° C.) may be completed before the semiconductor pillars 138 are formed, thereby obviating any degradation of the semiconductor pillars 138 that may have been caused by such high temperature processing. Additionally, forming the semiconductor pillars 138 at this stage of processing can be after other processes that may cause degradation of the semiconductor pillars 138. In some specific examples, the semiconductor material 136 is indium gallium zinc oxide (IGZO). Other semiconductor materials may be implemented. In some embodiments, which can be combined with other embodiments described herein, the semiconductor material 136 includes oxygen (O) and at least one of indium (In), zinc (Zn), gallium (Ga), oxygen (O), tin (Sn), aluminum (Al), and hafnium (Hf). Examples of the semiconductor material 136 include, but are not limited to, In—Ga—Zn—O, In—Zn—O, In—Ga—Sn—O, In—Zn—Sn—O In—Ga—Zn—Sn—O, In—Sn—O, Hf—In—Zn—O, Ga—Zn—O, In—O, Al—Sn—Zn—O, Zn—O, Zn—Sn—O, Al—Zn—O, Al—Zn—Sn—O, Hf—Zn—O, Sn—O, and Al—Sn—Zn—In—O. The semiconductor material 136 can be doped with n-type or p-type dopants, such as boron (B) or nitrogen (N).

Referring to FIG. 10, subsequent processing is performed, including forming a respective capacitor for the DRAM cells. Any excess semiconductor material 136 (e.g., formed on and over the top surface of the first ILD layer 128) is removed, such as by a planarization process. A CMP process can be used to remove excess semiconductor material 136. The planarization can form top surfaces of the first ILD layer 128, the gate dielectric layer 120, and the semiconductor pillars 138 to be co-planar.

An etch stop layer 150 is formed on respective top surfaces of the first ILD layer 128, the gate dielectric layer 120, and the semiconductor pillars 138. The etch stop layer 150 can be any appropriate dielectric material, such as silicon nitride, silicon oxynitride, or the like, that has etch selectivity with adjoining materials. The etch stop layer 150 can be deposited by any appropriate deposition process, such as CVD, PVD, or the like.

A conductive pad 152 is formed through the etch stop layer 150 to contact a respective semiconductor pillar 138. A recess can be formed through the etch stop layer 150 and into the first ILD layer 128 and a respective semiconductor pillar 138 using any appropriate photolithography and etching process. The conductive pad 152 can be deposited in the recess, such as by CVD, ALD, PVD, or the like, and any excess can be removed by a planarization process, such as a CMP. The conductive pad 152 can include a barrier layer, such as titanium nitride (TiN), tantalum nidride (TiN), or the like, and a metal or metal-containing material on the barrier layer, such as tungsten (W), aluminum (Al), copper (Cu), or the like. The conductive pad 152 forms an ohmic contact with the respective semiconductor pillar 138 that the conductive pad 152 contacts.

A second ILD layer 154 is formed on the etch stop layer 150 and the conductive pads 152. The second ILD layer 154 can be a same or similar material as the first ILD layer 128 and can be deposited by a same or similar deposition process. The second ILD layer 154 is then patterned with an opening through the second ILD layer 154 to a respective conductive pad 152. The patterning can be by using photolithography and etching processes. The etching process can be an anisotropic etch, such as an RIE.

A capacitor is formed in a respective opening through the second ILD layer 154. The capacitor includes an outer plate 160, a capacitor dielectric layer 162, and an inner plate 164. The outer plates 160 are conformally formed along surfaces of the openings through the second ILD layer 154. In some examples, the outer plates 160 are formed using a conformal deposition process, such as ALD. The conformal deposition process can form a conformal layer on surfaces that define the openings (e.g., including sidewall surfaces of the second ILD layer 154 and the top surface of the respective conductive pad 152). A node separation process is performed to remove some of the conformal layer on top surfaces of the second ILD layer 154. The node separation process can include filling the openings with a fill material, and performing a planarization process, such as a CMP, to remove portions of the conformal layer from the top surfaces of the second ILD layer 154 between the openings. The fill material is then removed by any appropriate etch process, which may be isotropic or anisotropic.

The capacitor dielectric layer 162 is then formed on the inner surfaces of the respective outer plates 160. The capacitor dielectric layer 162 can be formed by a conformal deposition, such as ALD, that forms a conformal capacitor dielectric layer 162 in a respective opening and along the inner surfaces of the respective outer plate 160. The capacitor dielectric layer 162 can extend between the openings on the top surface of the second ILD layer 154.

The inner plates 164 are then formed on the outer plates 160. The inner plates 164 can be formed by any appropriate deposition process, such as ALD, CVD, PVD, or the like, that forms the inner plates 164 on the capacitor dielectric layer 162. In the illustrated example, the inner plates 164 fill the remaining unfilled portion of the openings, although in some examples, the inner plates 164 may not fill the remaining unfilled portion of the openings. As illustrated, the inner plates 164 can be formed by a continuous material deposited in and between the openings. Since the inner plates 164 form the terminals of the respective DRAM cells that are electrically connected to a power supply node (e.g., a ground node), as described with respect to FIG. 1, the inner plates 164 can be electrically connected together by the continuous material that forms the inner plates 164. The inner plates 164 being electrically connected together, e.g., by the material of the inner plates 164 forms a power supply node (e.g., a ground node) connected between multiple DRAM cells. In some examples, the material of the outer plates 160 and the material of the inner plates 164 can be any conductive material, such as a metal or metal-containing material, such as titanium nitride (TiN). In some examples, the material of the capacitor dielectric layer 162 can be any dielectric material, and further, can be any high-k dielectric material (e.g., having a k-value of greater than 4.0).

A 3D DRAM cell as shown in FIG. 10 includes an access transistor and the capacitor. The access transistor includes a respective semiconductor pillar 138, gate dielectric layer 120, and gate electrode 122. The semiconductor pillar 138 includes a vertical channel region that extends perpendicular to a main (e.g., the top surface) of the substrate 102 (e.g., Z-direction). In operation, carriers flow vertically, e.g., along or near sidewalls of the semiconductor pillar 138, which regions form the vertical channel region. The semiconductor pillar 138 of the access transistor is electrically connected to the capacitor (e.g., a respective outer plate 160) through a respective conductive pad 152.

FIGS. 11 through 19 are cross-sectional views of intermediate structures formed during a second method used to form 3D DRAM cells according to some examples of the present disclosure. The 3D DRAM cells formed according to the second method of FIGS. 11 through 19 can be similar to the horizontal channel device 3D DRAM cells shown in FIG. 3.

Figure 11:
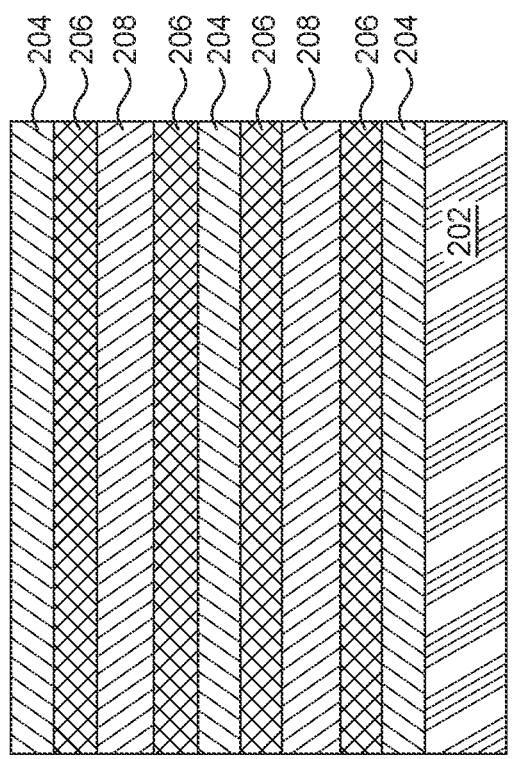

Referring to FIG. 11, a film stack is deposited on a substrate 202. The substrate 202 can be as the substrate 102 described above. The film stack includes one or more unit stacks (e.g., two unit stacks in the illustrated example) that are, in part, used sacrificially to form 3D DRAM cells. As will become apparent, this method forms two layers of 3D DRAM cells. In other examples, repeating the unit stacks of the film stack can enable forming additional layers of 3D DRAM cells. Also, using one instance of the unit stack in the film stack can enable forming one layer of 3D DRAM cells.

The film stack includes multiple unit stacks, where a unit stack includes a first dielectric layer 204, a second dielectric layer 206, a sacrificial layer 208, and another second dielectric layer 206. The unit stack of the film stack is, includes, or consists of (in this example) a first dielectric layer 204, a second dielectric layer 206 on the first dielectric layer 204, a sacrificial layer 208 on the second dielectric layer 206, and another second dielectric layer 206 on the sacrificial layer 208. Two instances of this unit stack are stacked on the substrate 202 in FIG. 11. The first dielectric layers 204 can each be a same dielectric material, and the second dielectric layers 206 can each be a same dielectric material that is different from and has etch selectivity between the dielectric material of the first dielectric layers 204. The sacrificial layers 208 can each be a same material that is different from and has etch selectivity between the dielectric materials of the first dielectric layers 204 and the second dielectric layers 206. Generally, the materials of the different layers permit selectively etching targeted layers during processing, as will become apparent. The film stack is used as a mold for forming the DRAM cells. In some examples, the first dielectric layers 204 include a silicon oxide; the second dielectric layers 206 include a silicon nitride; and the sacrificial layers 208 include an amorphous or polycrystalline silicon material. Each layer of the first dielectric layers 204, second dielectric layer 206, and sacrificial layers 208 can be deposited by any appropriate deposition process, such as ALD, CVD, PVD, or the like.

The film stack can be patterned into different cell regions, although not apparent from the cross-section of FIG. 11. For example, openings can be etch generally parallel to the cross-section of FIG. 11 (e.g., openings are parallel to the X-Z plane and spaced apart in the Y-direction) to separate or cut different cell regions. A dielectric fill material can fill those openings.

Figure 12:
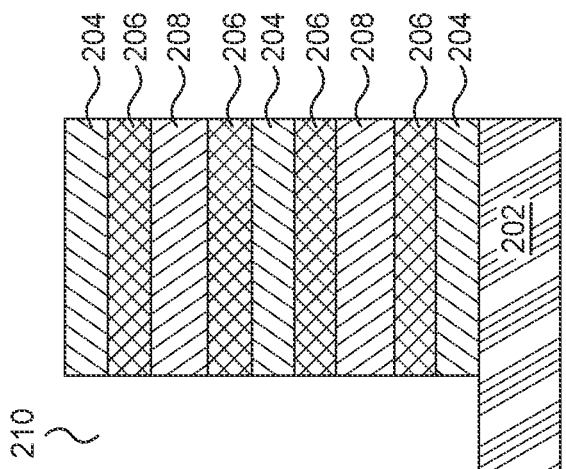

In FIG. 12, an opening 210 is formed through the film stack (e.g., through the first dielectric layers 204, second dielectric layers 206, and sacrificial layers 208). The opening 210 can be formed using photolithography and an anisotropic etch, such as RIE or the like.

Figure 13:
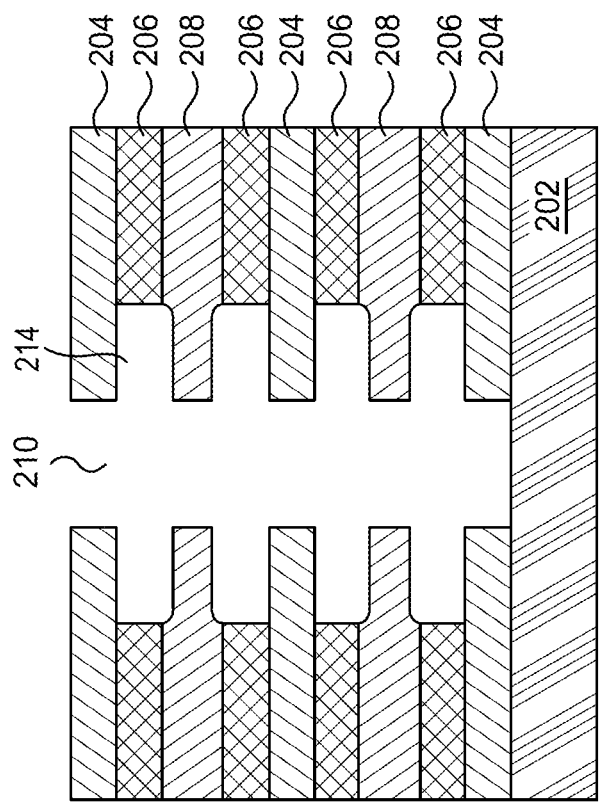

In FIG. 13, the second dielectric layers 206 are pulled back from the opening 210 to form lateral recesses 214 from the opening 210. The pull back process can be any appropriate isotropic etch that selectively etches the second dielectric layers 206. For example, when the second dielectric layers 206 are silicon nitride, a hot phosphoric acid etch process can be used to pull back the second dielectric layers 206 to form the lateral recesses 214. As illustrated, the etch process may also etch other layers, such as the sacrificial layers 208, although at a lower rate, and hence, a lesser amount removed, than the second dielectric layers 206.

Figure 14:
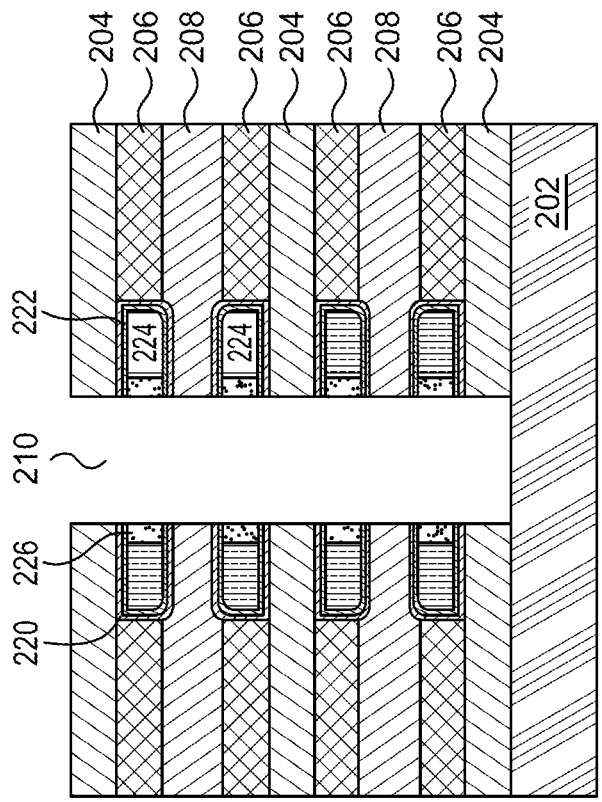

FIG. 14 illustrates gate interfacial layers 220, gate dielectric layers 222, gate electrodes 224, and dielectric spacers 226. The gate interfacial layers 220 are formed on surfaces of the sacrificial layer 208, second dielectric layer 206, and first dielectric layer 204 that define a respective lateral recess 214. The gate dielectric layers 222 are conformally formed on respective gate interfacial layers 220 in the lateral recesses 214, and the gate electrodes 224 are formed on the gate dielectric layers 222. The gate electrodes 224 are recessed in the lateral recesses 214 from sidewalls that define the opening 210. The dielectric spacers 226 are disposed along sidewalls of respective gate electrodes 224 and between the respective gate electrodes 224 and the opening 210. The gate interfacial layers 220, gate dielectric layers 222, gate electrodes 224, and dielectric spacers 226 can be formed by any appropriate processes and can be any appropriate materials.

In some examples, the gate interfacial layers 220 can be deposited by a conformal deposition process, such as ALD. The conformal deposition process can form a conformal layer on surfaces that define the opening 210 and lateral recesses 214. In some examples, the gate interfacial layers 220 are alumina ($Al_2O_3$).

The gate dielectric layers 222 can then be deposited using a conformal deposition process, such as ALD. The conformal deposition process can form a conformal layer on the conformal layer of the gate interfacial layers 220 (e.g., in the opening 210 and the lateral recesses 214). In some examples, the gate dielectric layers 222 are silicon oxide, a high-k dielectric material, or any other dielectric material.

A conductive material of the gate electrodes 224 can then be deposited using a conformal deposition process, such as ALD. The conformal deposition process can form a conformal layer on the conformal layer of the gate dielectric layers 222, which can fill the lateral recesses 214. In some examples, the gate electrodes 224 are or include one or more metal or metal-containing materials, such as tungsten (W).

In some examples, the respective conformal layers that form the gate interfacial layers 220, gate dielectric layer 222, and gate electrodes 224 do not fill the opening 210. In such cases, although not illustrated to scale, the lateral recesses 214 can have a height (e.g., generally corresponding to a thickness of a respective second dielectric layer 206) that is less than a width of the opening 210, such that the lateral recesses 214 are filled and/or are pinched off at a sidewall of the opening 210 before the opening 210 is filled. Under such circumstances, an isotropic etch process can be used to remove the material of the gate electrodes 224 from the opening 210 and recess the gate electrodes 224 in the lateral recesses 214 from a corresponding sidewall surface of the opening 210.

A material of the dielectric spacers 226 can then be deposited on the conformal layer of the gate dielectric layers 222 and on the sidewalls of the gate electrodes 224 in the lateral recesses 214. In some examples, the dielectric spacers 226 can be silicon nitride, silicon oxynitride, or the like.

Like the gate electrodes 224, an isotropic etch process can be used to remove the material of the dielectric spacers 226 from the opening 210 while the dielectric spacers 226 remain in the lateral recesses 214 adjoining the respective gate electrodes 224. One or more isotropic etch processes can then be used to remove the conformal layers of the gate dielectric layers 222 and gate interfacial layers 220 from the sidewalls that define the opening 210 while the gate dielectric layers 222 and gate interfacial layers 220 remain in the lateral recesses 214.

The above described deposition and etch processes are provided as an example to form the gate interfacial layers 220, gate dielectric layers 222, gate electrodes 224, and dielectric spacers 226. Any appropriate deposition processes and/or any appropriate etch process (e.g., anisotropic etch processes, such as RIE) can be used instead of or in addition to the processes described above.

In FIG. 15, the opening 210 is filled with a fill material 240. The fill material 240 can be any appropriate material. In some examples, the fill material 240 can be the same material as the sacrificial layers 208. The fill material 240 can be deposited using any appropriate deposition process, such as FCVD.

Openings 242 are formed through the film stack (e.g., through the first dielectric layers 204, second dielectric layers 206, and sacrificial layers 208). As will become apparent, each opening 242 is used in the formation of capacitors that will be electrically connected to respective access transistors, of which the gate electrodes 224 and gate dielectric layers 222 are a part. Each opening 242 is disposed some lateral distance (e.g., X-direction in FIG. 15) from the corresponding gate electrodes 224 and gate dielectric layers 222, with the corresponding gate electrodes 224 and gate dielectric layers 222 disposed laterally between the respective opening 242 and where the opening 210 was formed (e.g., which is filled by the fill material 240). The openings 242 can be formed using photolithography and an anisotropic etch, such as a RIE or the like.

In FIG. 16, the sacrificial layers 208 are pulled back from the respective openings 242 to form lateral recesses 250 from the respective openings 242. The pull back process can be any appropriate isotropic etch that selectively etches the sacrificial layers 208. For example, when the sacrificial layers 208 are silicon, a tetramethylammonium hydroxide (TMAH) etch process or dry plasma isotropic etch can be used to pull back the sacrificial layers 208.

Figure 17:
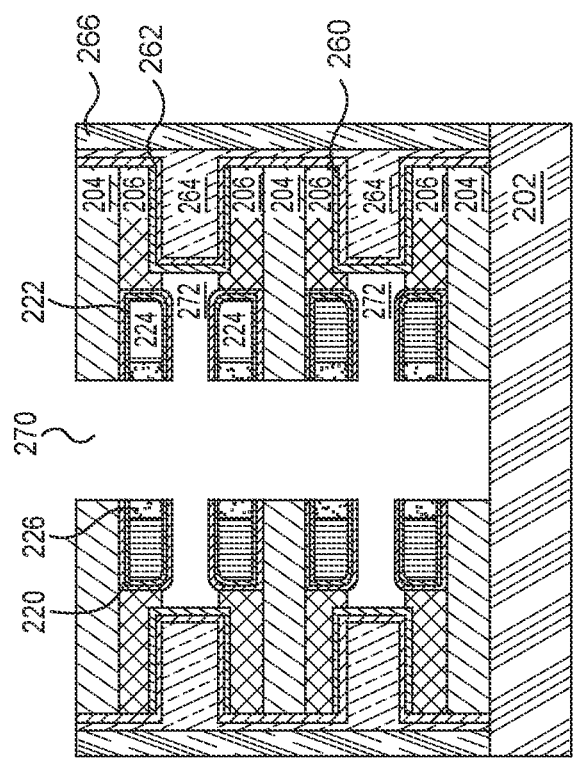

The lateral recesses 250 may be expanded to form enlarged lateral recesses, as indicated in FIG. 17. The expansion can include an isotropic etch that selectively etches the second dielectric layers 206 and/or an isotropic etch that selectively etches the dielectric fill material used to separate cell regions (as described above). The isotropic etch can be a wet or dry process. In some examples where the second dielectric layers 206 are silicon nitride, a hot phosphoric acid etch process or a dry plasma etch process can be used to etch the second dielectric layers 206.

FIG. 17 shows the formation of capacitors in the enlarged lateral recesses (corresponding to the lateral recesses 250). Each capacitor includes an outer plate 260, a capacitor dielectric layer 262, and an inner plate 264. The outer plates 260 are conformally formed along surfaces of the enlarged lateral recesses. In some examples, the outer plates 260 are formed using a conformal deposition process, such as ALD. The conformal deposition process can form a conformal layer on surfaces that define the openings 242 and enlarged lateral recesses (e.g., including a respective sidewall surface of the sacrificial layer 208). A node separation process is performed to remove some of the conformal layer on vertical sidewalls that define the openings 242 to form the outer plates 260 in respective enlarged lateral recesses. The node separation process can include filling the openings 242 and enlarged lateral recesses with a fill material, and performing appropriate anisotropic and/or isotropic etch processes to remove portions of the conformal layer from the vertical sidewalls that define the openings 242 (e.g., vertical sidewalls of the first dielectric layers 204 and second dielectric layers 206) and to remove the fill material.

The capacitor dielectric layers 262 are then formed on the inner surfaces of the respective outer plates 260. The capacitor dielectric layers 262 can be formed by a conformal deposition, such as ALD, that forms a conformal capacitor dielectric layer 262 in a respective opening 242 (e.g., along vertical sidewalls of the first dielectric layers 204 and second dielectric layers 206 that define the opening 242) and the inner surfaces of the respective outer plate 260.

The inner plates 264 are then formed on the outer plates 260. The inner plates 264 can be formed by a conformal deposition, such as ALD, that forms the inner plates 264 on the capacitor dielectric layers 262. In the illustrated example, the inner plates 264 fill the remaining unfilled portion of the enlarged lateral recesses, although in some examples, the inner plates 264 may not fill the remaining unfiled portion of the enlarged lateral recesses. As illustrated, the inner plates 264 can be formed by a continuous material deposited in the respective opening 242 and enlarged lateral recesses. Since the inner plates 264 form the terminals of the respective DRAM cells that are electrically connected to a power supply node (e.g., a ground node), as described with respect to FIG. 1, the inner plates 264 can be electrically connected together by the continuous material that forms the inner plates 264.

In the illustrated example shown in FIG. 17, the material of the inner plates 264 does not fill the openings 242, and a conductive fill material 266 is formed in the unfilled portion of the openings 242. In some examples, the material of the inner plates 264 fills the remaining unfilled portion of the openings 242. The inner plates 264 being electrically connected together, e.g., by the material of the inner plates 264 and/or the conductive fill material 266 forms a power supply node (e.g., a ground node) connected between multiple DRAM cells. In examples where the conductive fill material 266 is used, the conductive fill material 266 can be deposited by any appropriate deposition process, such as CVD, PVD, or the like.

In some examples, the material of the outer plates 260 and the material of the inner plates 264 can be any conductive material, such as a metal or metal-containing material, such as titanium nitride (TiN). In some examples, the material of the capacitor dielectric layer 262 can be any dielectric material, and further, can be any high-k dielectric material (e.g., having a k-value of greater than 4.0). In some examples, the conductive fill material 266 can be any conductive material, such as silicon germanium (e.g., doped silicon germanium).

Figure 18:
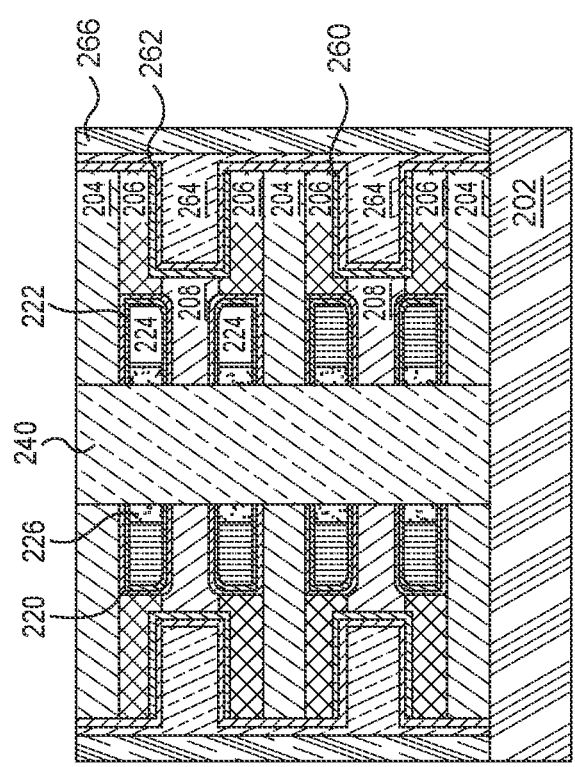

In FIG. 18, the fill material 240 and remaining sacrificial layers 208 are removed. The fill material 240 and sacrificial layers 208 can be removed using any appropriate etch process(es). In examples where the fill material 240 and the sacrificial layers 208 are a same material, a continuous isotropic etch process can be used to remove the fill material 240 and sacrificial layers 208. For example if the fill material 240 and sacrificial layers 208 are both silicon, tetramethyl-ammonium hydroxide (TMAH) may be used to remove the fill material 240 and sacrificial layers 208. Removing the fill material 240 forms an opening 270 (which corresponds to the opening 210), and removing the sacrificial layers 208 forms lateral recesses 272 (or also referred to herein as recess openings) recessed from the respective sidewalls of the opening 270.

Figure 19:
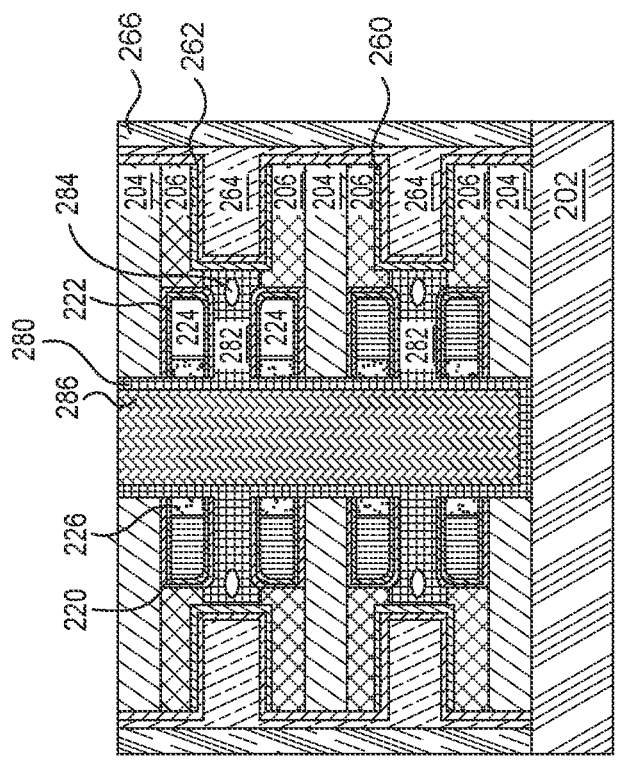

In FIG. 19, a semiconductor material 280 is conformally deposited in the opening 270 and lateral recesses 272. The semiconductor material 280 deposited in the lateral recesses 272 forms respective semiconductor layers 282. Each semiconductor layer 282 in a respective lateral recess 272 is formed on (e.g., directly contacting) a surface of the outer plates 260 of respective capacitors that are exposed through the respective lateral recess 272. A channel region of an access transistor is to be disposed in the semiconductor layer 282 disposed in a respective lateral recess 272.

The semiconductor material 280 can be deposited by a conformal deposition, in some examples. The conformal deposition can result in voids 284 being formed in the semiconductor layers 282 deposited in the lateral recesses 272. For example, the conformal deposition can result in pinch-off of the semiconductor material 280 where a lateral recess 272 meets the opening 270, which can cause a void 284 to remain in the semiconductor layer 282. In other examples, the lateral recesses 272 are completely filled by the semiconductor material 280 and semiconductor layer 282 without a void. In various examples, any lateral recess 272 can be completely filled by the semiconductor material 280 or filed with the semiconductor material 280 having a void or seam therein. In some examples, the semiconductor material 280 can be deposited by ALD, CVD, or any other conformal deposition process.

The semiconductor material 280 can be any appropriate semiconductor material. Some examples contemplate that the semiconductor material 280 is a material that may become degraded due to high temperature processing, plasma processing, or any other semiconductor processing. By replacing the sacrificial layers 208 with the semiconductor layers 282 as described, high temperature processing (e.g., such as equal to or greater than 400° C.) may be completed before the semiconductor layers 282 are formed, thereby obviating any degradation of the semiconductor layers 282 that may have been caused by such high temperature processing. Additionally, forming the semiconductor layers 282 at this stage of processing can be after other processes that may cause degradation of the semiconductor layers 282. In some specific examples, the semiconductor material 280, and hence, the semiconductor layers 282, is indium gallium zinc oxide (IGZO). Other semiconductor materials may be implemented. The semiconductor material 280 may be similar to the semiconductor material 136 described above.

A conductive fill material 286 is formed on the semiconductor material 280 filling the opening 270. The conductive fill material 286 can be deposited in the recess, such as by CVD, ALD, PVD, or the like, and any excess can be removed by a planarization process, such as a CMP. The conductive fill material 286 can include a barrier layer, such as titanium nitride (TiN), tantalum nidride (TaN), or the like, and a metal or metal-containing material on the barrier layer, such as tungsten (W), aluminum (Al), copper (Cu), or the like. The conductive fill material 286 and semiconductor material 280 may form a bit line contact. This contact is along a vertical axis around which mirrored DRAM pairs are mirrored.

A 3D DRAM cell as shown in FIG. 19 includes an access transistor and the capacitor. The access transistor includes a respective semiconductor layer 282, gate dielectric layer 222, and gate electrode 224. The semiconductor layer 282 includes a horizontal channel region that extends parallel to a main (e.g., the top surface) of the substrate 202. In operation, carriers flow horizontally, e.g., along or near top and/or bottom surfaces of the semiconductor layer 282, which regions form the horizontal channel region. The semiconductor layer 282 of the access transistor is electrically connected (e.g., by direct contact) to the capacitor (e.g., a respective outer plate 260).

While the foregoing is directed to various examples of the present disclosure, other and further examples may be devised without departing from the basic scope thereof, and the scope thereof is determined by the claims that follow.

The invention claimed is:

1. A method for semiconductor processing, the method comprising:
providing a substrate;
forming at least a first dielectric layer over the substrate;
forming a sacrificial material layer over the first dielectric layer;
removing a portion of the sacrificial material layer to form at least two adjacent extending portions of sacrificial material while leaving a portion of the sacrificial material layer over the first dielectric layer and between the at least two adjacent extending portions of sacrificial material;
forming a spacer layer over the portion of the sacrificial material between the at least two adjacent extending portions of sacrificial material
forming a gate dielectric layer on at least one side wall of the adjacent extending portions of sacrificial material disposed on a substrate;
forming a gate electrode on the gate dielectric layer;
after forming the gate electrode, removing the sacrificial material to form a recess opening and a gap between the spacer layer and the first dielectric layer;
forming a semiconductor material in the recess opening where the sacrificial material was removed; and
forming a capacitor that is electrically connected to the semiconductor material.

2. The method of claim 1, wherein the capacitor is formed before the sacrificial material is removed.

3. The method of claim 1, wherein the capacitor is formed after forming the semiconductor material.

4. The method of claim 1, wherein the semiconductor material comprises indium gallium zinc oxide (IGZO).

5. The method of claim 1, wherein the semiconductor material, the gate dielectric layer, and the gate electrode form, at least in part, a vertical channel device, the semiconductor material including a vertical channel region that extends perpendicular to a main surface of the substrate.

6. A method for semiconductor processing, the method comprising:
providing a substrate;
forming at least a first dielectric layer over the substrate;
forming a sacrificial pillar and an adjacent layer of the sacrificial material extending away from a side wall of the pillar on the substrate, the sacrificial pillar extending away from a surface of the substrate;
forming a spacer layer over the adjacent layer of the sacrificial material;
forming a gate dielectric layer on a sidewall surface of the sacrificial pillar;
forming a gate electrode on the gate dielectric layer;
after forming the gate electrode, replacing the sacrificial pillar and the adjacent layer of the sacrificial material with a semiconductor material to form a semiconductor pillar and a semiconductor layer extending between the spacer layer and the first dielectric layer; and
forming a capacitor electrically connected to the semiconductor pillar.

7. The method of claim 6, wherein the semiconductor pillar includes indium gallium zinc oxide (IGZO).

8. The method of claim 6, further comprising:
depositing a conductive layer on the substrate;
depositing a sacrificial layer on the conductive layer;
patterning the conductive layer and the sacrificial layer into a patterned line; and
patterning the sacrificial layer of the patterned line to form the sacrificial pillar.

9. The method of claim 6, further comprising forming an inter-layer dielectric layer on the gate electrode and the gate dielectric layer, wherein replacing the sacrificial pillar with the semiconductor pillar includes:
exposing the sacrificial pillar through the inter-layer dielectric layer; and
removing the sacrificial pillar through where the sacrificial pillar is exposed through the inter-layer dielectric layer.

10. The method of claim 6, further comprising:
forming a first inter-layer dielectric layer on the gate electrode and the gate dielectric layer; and
forming a second inter-layer dielectric layer on the first inter-layer dielectric layer, the first inter-layer dielectric layer being disposed between the substrate and the second inter-layer dielectric layer, the capacitor being formed, at least in part, in the second inter-layer dielectric layer.

11. The method of claim 6, wherein the semiconductor pillar, the gate dielectric layer, and the gate electrode form, at least in part, a vertical channel device.

12. The method of claim 11, wherein the vertical channel device and the capacitor form at least a portion of a dynamic random access memory (DRAM) cell.

13. A method for semiconductor processing, the method comprising:
forming a film stack on a substrate, the film stack comprising one or more unit stacks, each unit stack of the one or more unit stacks comprising a first dielectric layer and a sacrificial layer;
forming a first opening in the film stack;
laterally recessing the first dielectric layer in each unit stack exposed by the first opening to form a first lateral recess;
forming a gate dielectric layer in the first lateral recess and on the sacrificial layer in each unit stack;
forming a gate electrode on the gate dielectric layer in each unit stack; and
after forming the gate electrode, replacing at least a portion of the sacrificial layer with a semiconductor layer; and
forming a capacitor electrically connected to the semiconductor layer.

14. The method of claim 13, wherein the semiconductor layer includes indium gallium zinc oxide (IGZO).

15. The method of claim 13, wherein the capacitor is formed before replacing the at least the portion the sacrificial layer with the semiconductor layer.

16. The method of claim 13, wherein forming the capacitor comprises:
forming a second opening in the film stack disposed laterally from where the first opening was formed;

laterally recessing the sacrificial layer in each unit stack from the second opening to form a second lateral recess; and forming the capacitor in the second lateral recess.

17. The method of claim 13, wherein each unit stack of the one or more unit stacks further comprises a second dielectric layer that is a same material as the first dielectric layer, the sacrificial layer being disposed between the first dielectric layer and the second dielectric layer.

18. The method of claim 13, wherein the semiconductor layer, the gate dielectric layer, and the gate electrode form, at least in part, a horizontal channel device.

19. The method of claim 18, wherein the horizontal channel device and the capacitor form, at least in part, a dynamic random access memory (DRAM) cell.

* * * * *